(12) United States Patent
Desai et al.

(10) Patent No.: US 8,378,478 B2
(45) Date of Patent: Feb. 19, 2013

(54) ENHANCED STACKED MICROELECTRONIC ASSEMBLIES WITH CENTRAL CONTACTS AND VIAS CONNECTED TO THE CENTRAL CONTACTS

(75) Inventors: Kishor Desai, Fremont, CA (US); Belgacem Haba, Saratoga, CA (US); Wael Zohni, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 154 days.

(21) Appl. No.: 12/953,994

(22) Filed: Nov. 24, 2010

(65) Prior Publication Data

US 2012/0126389 A1  May 24, 2012

(51) Int. Cl.
H01L 23/02  (2006.01)

(52) U.S. Cl. ............... 257/686; 257/777; 257/E23.085; 438/106

(58) Field of Classification Search .......... 257/686, 257/690, 698, 777, 784, E23.085; 438/106, 438/109
See application file for complete search history.

(56) References Cited

U.S. PATENT DOCUMENTS

| 4,941,033 | A | 7/1990 | Kishida |
| 5,148,265 | A | 9/1992 | Khandros et al. |
| 5,148,266 | A | 9/1992 | Khandros et al. |
| 5,323,060 | A | 6/1994 | Fogal et al. |
| 5,347,159 | A | 9/1994 | Khandros et al. |
| 5,399,898 | A | 3/1995 | Rostoker |
| 5,495,394 | A | 2/1996 | Kornfeld et al. |
| 5,600,541 | A | 2/1997 | Bone et al. |
| 5,679,977 | A | 10/1997 | Khandros et al. |
| 5,977,640 | A | 11/1999 | Bertin et al. |
| 6,818,474 | B2 | 11/2004 | Kim et al. |
| 7,061,121 | B2 | 6/2006 | Haba |
| 7,423,336 | B2 * | 9/2008 | Corisis et al. ............... 257/686 |

* cited by examiner

*Primary Examiner* — Quoc Hoang
(74) *Attorney, Agent, or Firm* — Lerner, David, Littenberg, Krumholz & Mentlik, LLP

(57) ABSTRACT

The microelectronic assembly includes a first microelectronic element having a front surface, a plurality of contacts exposed at the front surface, and a rear surface remote from the front surface; a second microelectronic element having a front surface facing the rear surface of the first microelectronic element and projecting beyond an edge of the first microelectronic element, the second microelectronic element having a plurality of contacts exposed at its front surface; a dielectric region overlying the front surfaces of the microelectronic elements, the dielectric region having a major surface facing away from the microelectronic elements; metallized vias within openings in the dielectric region extending from the plurality of contacts of the first and second microelectronic elements; and leads extending along a major surface of the dielectric region from the vias to terminals exposed at the major surface.

26 Claims, 9 Drawing Sheets

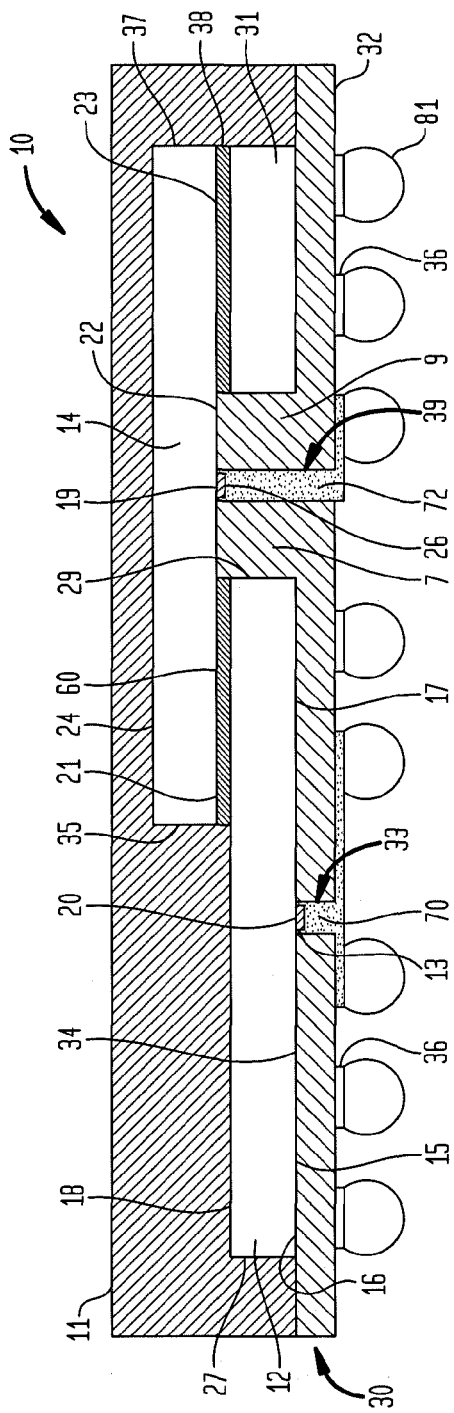
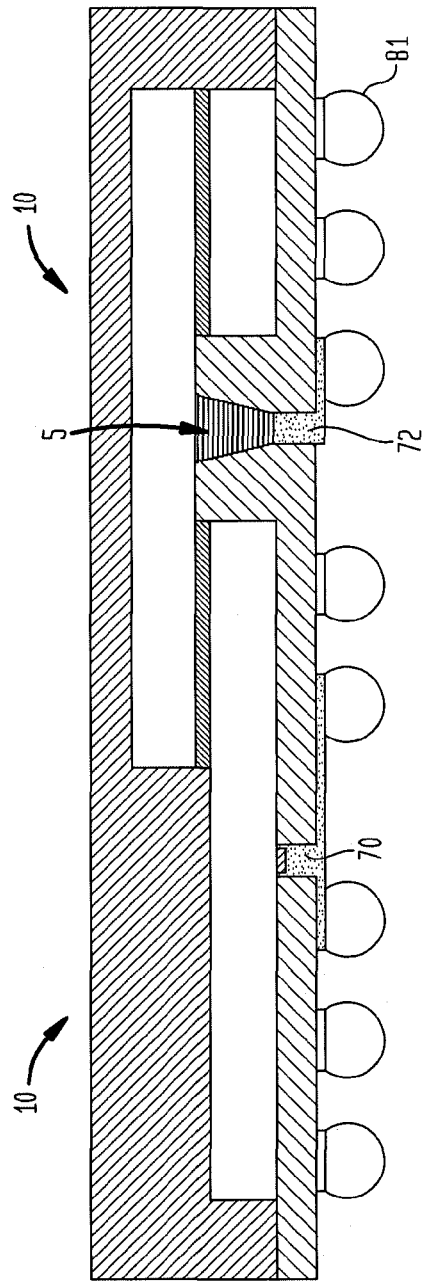
FIG. 1
FIG. 2

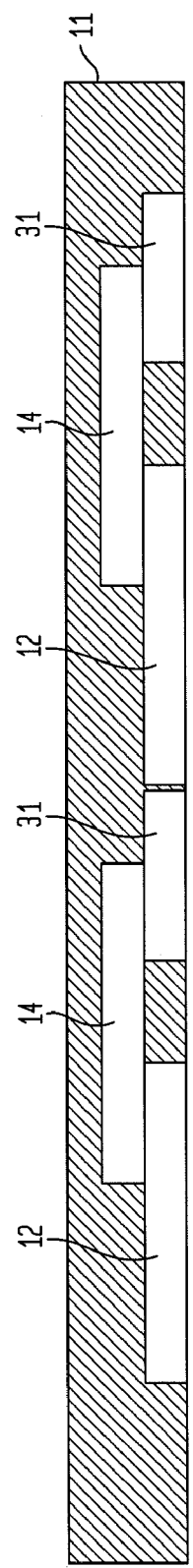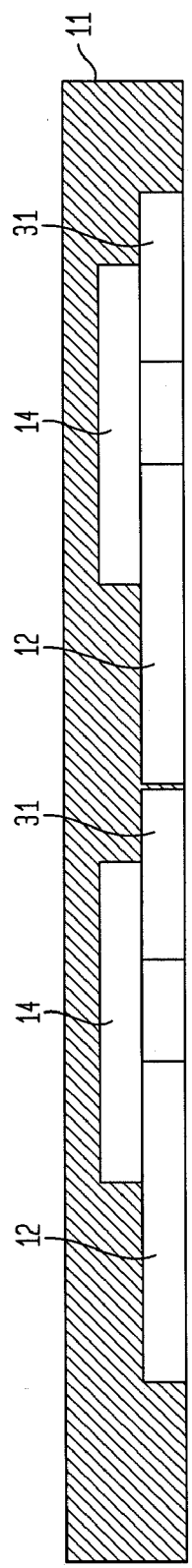
FIG. 8A
FIG. 8B

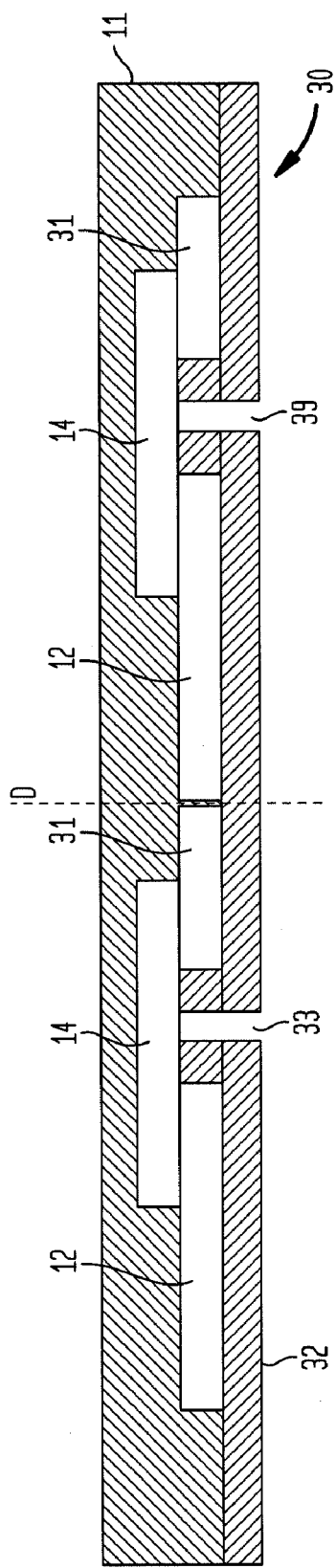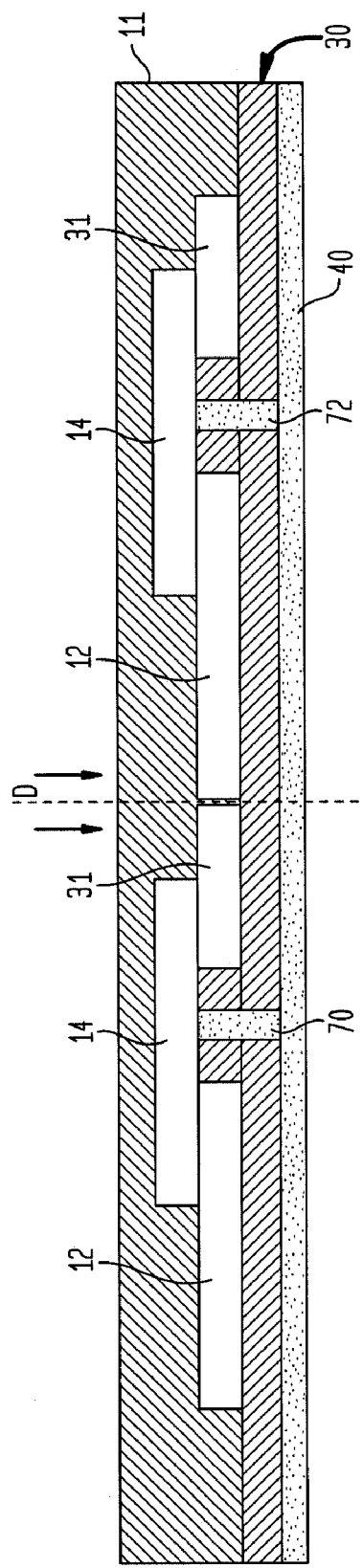

ENHANCED STACKED MICROELECTRONIC ASSEMBLIES WITH CENTRAL CONTACTS AND VIAS CONNECTED TO THE CENTRAL CONTACTS

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low, overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; and 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

BRIEF SUMMARY OF THE INVENTION

The present disclosure relates to microelectronic assemblies and methods of making thereof. In one embodiment, the microelectronic assembly includes a first microelectronic element having a front surface, a plurality of contacts exposed at the front surface, and a rear surface remote from the front surface; a second microelectronic element having a front surface facing the rear surface of the first microelectronic element and projecting beyond an edge of the first microelectronic element, the second microelectronic element having a plurality of contacts exposed at its front surface; a dielectric region overlying the front surfaces of the microelectronic elements, the dielectric region having a major surface facing away from the microelectronic elements; metallized vias within openings in the dielectric region extending from the plurality of contacts of the first and second microelectronic elements; and leads extending along the major surface of the dielectric region from the vias to terminals exposed at the major surface.

In another embodiment, the microelectronic assembly, includes a first microelectronic element having a front surface, a plurality of contacts exposed at the front surface, and a rear surface remote from the front surface; a second microelectronic element having a front surface facing the rear surface of the first microelectronic element and projecting beyond an edge of the first microelectronic element, the second microelectronic element having a plurality of contacts exposed at its front surface; a dielectric region overlying the front surfaces of the microelectronic elements; metal posts extending from the plurality of contacts of the second microelectronic element; metallized vias within openings in the dielectric region extending from the plurality of metal posts; and leads extending along a major surface of the dielectric region from the vias to terminals exposed at the major surface, the leads electrically connected to the contacts of the first and second microelectronic elements, including at least some leads extending from the vias.

At least some of the metal posts may extend from the plurality of contacts of the first microelectronic element. At least some leads may extend to the metalized vias extending from the at least some substantially rigid metal posts.

At least one of the first microelectronic element or the second microelectronic element may include a dynamic random access memory (DRAM) storage. The microelectronic may further include solder balls connected to the terminals.

The microelectronic assembly may further include an overmold overlying the rear surface and at least partially overlies an edge surface of the first microelectronic element.

The second microelectronic element has a rear surface remote from a front surface thereof. An overmold overlies its rear surface and at least partially overlies an edge surface of the second microelectronic element. The metallized vias may be formed by depositing a metal at least within the openings. The microelectronic assembly may further include a support member disposed between the second microelectronic element and the face of the microelectronic assembly.

The present disclosure further relates to a stacked microelectronic assembly including at least first and second and second microelectronic assemblies, as described above. In this embodiment, the second microelectronic assembly is stacked atop the first microelectronic assembly and electrically connected thereto. The first and second stacked microelectronic assemblies may be electrically connected through electrically conductive columns extending between a front face of the second microelectronic assembly and the rear face of the first microelectronic assembly facing such front face. Each of the electrically conductive columns may include a bond metal The present disclosure also relates to a system including a microelectronic assembly as described above and one or more other electronic components electrically connected to the assembly. The system may further include a housing. The microelectronic assembly and the other electronic components may be mounted to the housing.

The present disclosure also relates to methods for making microelectronic assemblies. In one embodiment, the method includes placing a spacer and a first microelectronic element face down on a carrier with an opening between them, the first microelectronic element including a plurality of contacts; placing a second microelectronic element face down on the spacer and the first microelectronic element such that contacts of the second microelectronic element are exposed within the opening; forming an overmold overlying rear faces of the first and second microelectronic elements; removing the carrier therefrom; forming a dielectric region overlying front faces of the first and second microelectronic elements; forming openings through the dielectric region to expose the contacts of the first and second microelectronic elements, the dielectric region having a major surface facing away from the first and second microelectronic elements; and forming metalized vias extending within the openings to the contacts and traces extending along the major surface of the dielectric region, the step of forming including depositing metal into the openings and onto the major surface of the dielectric region.

The step of forming the overmold may include forming the overmold in a wafer or panel format. Performing all the steps of the method described above may form a structure containing a group of microelectronic assemblies on a wafer or panel, each microelectronic assembly including the first microelectronic assembly, the spacer, the second microelectronic assembly and the dielectric region. The method may further include separating the structure into individual microelectronic assemblies.

The step of metalizing the dielectric region may include depositing a metal onto the contacts of the microelectronic elements. The step of forming the dielectric region may include placing a partially cured dielectric element overlying the front surfaces of the microelectronic elements and heating the dielectric element to cause material of the dielectric element to flow. The step of forming the dielectric region may include molding a dielectric material onto the microelectronic elements. As used herein, depositing may include plating the metal. The step of forming the metalized vias and traces may include selectively depositing the metal onto trace areas of the major surface to form the plurality of traces. The step of metalizing the dielectric region may further include patterning the plated metal on the major surface to form the plurality of traces.

BRIEF DESCRIPTION OF THE DRAWINGS

FIG. 1 is a diagrammatic sectional elevation view of a stacked microelectronic assembly according to an embodiment of the present invention;

FIG. 2 is a diagrammatic sectional elevation view of stacked microelectronic assembly according to another embodiment of the present invention;

FIGS. 5-10 illustrate an exemplary method of making the stacked microelectronic assembly of FIG. 1;

DETAILED DESCRIPTION

Figure 3:
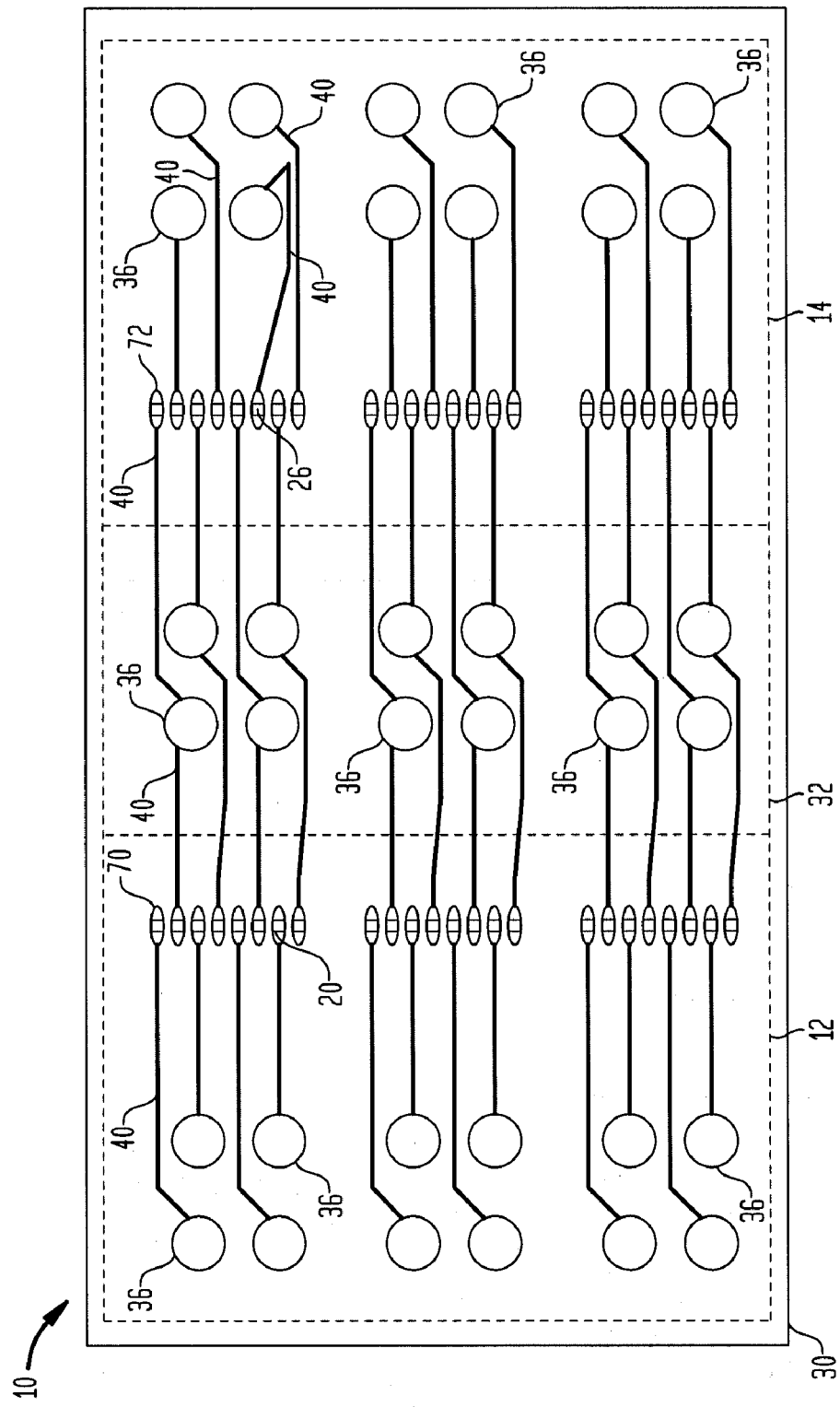
FIG. 3 is a bottom view of the stacked microelectronic assembly of FIG. 1.

With reference to FIG. 1, a stacked microelectronic assembly 10 according to an embodiment of the present invention includes a first microelectronic element 12 and a second microelectronic element 14. In some embodiments, the first and second microelectronic elements 12 and 14 may be a semiconductor chip, a wafer, or the like. At least one of the first and second microelectronic elements 12 and 14 may include a dynamic random access memory (DRAM) storage.

The first microelectronic element 12 has a front surface 16, a rear surface 18 remote therefrom, and first and second edges 27, 29, extending between the front and rear surfaces. The front surface 16 of the first microelectronic element 12 includes first and second end regions 15 and 17 and a central region 13 located between the first and second end regions 15 and 17. The first end region 15 extends between the central region 13 and first edge 27, and the second end region 17 extends between the central region 13 and the second edge 29. Electrical contacts 20 are exposed at the front surface 16 of the first microelectronic element 12. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure. The contacts 20 of the first microelectronic element 12 are exposed at the front surface 16 within the central region 13. For example, contacts 20 may be arranged in one or two parallel row adjacent the center of first surface 16.

The second microelectronic element 14 has a front surface 22, a rear surface 24 remote therefrom, and first and second edges 35, 37, extending between the front and rear surfaces. The front surface 22 of the second microelectronic element 14 includes first and second end regions 21 and 23 and a central region 19 located between the first and second end regions 21 and 23. The first end region 21 extends between the central region 19 and first edge 35, and the second end region 23 extends between the central region 19 and the second edge 37. Electrical contacts 26 are exposed at the front surface 22 of the second microelectronic element 14. The contacts 26 of the second microelectronic element 14 are exposed at the front surface 22 within the central region 19. For example, contacts 26 may be arranged in one or two parallel row adjacent the center of first surface 22.

As seen in FIG. 1, an overmold 11 overlies the rear surface 18 and at least a portion of the first edge 27 of the first microelectronic element 12. The overmold 11 also overlies the rear surface 24 and at least a portion of the second edge 37 of the second microelectronic element 14. The first and second microelectronic elements 12 and 14 are stacked relative to each other. In some embodiments, the front surface 22 of the second microelectronic element 14 and the rear surface 18 of the first microelectronic element 12 face each other. At least a portion of the second end region 23 of the second microelectronic element 14 overlies at least a portion of the second end region 17 of the first microelectronic element 12. At least a portion of the central region 19 of the second microelectronic element 14 projects beyond the second edge 29 of the first microelectronic element 12. Accordingly, the contacts 26 of the second microelectronic element 14 are positioned in a location beyond the second edge 29 of the first microelectronic element 12.

The microelectronic assembly 10 further includes a dielectric region 30 having oppositely-facing first and second surfaces 32 and 34. While FIG. 1 shows only one dielectric element 30, the microelectronic assembly 10 may include more than one dielectric element. One or more electrically conductive elements or terminals 36 are exposed at the first surface 32 of the dielectric region 30. At least some terminals 36 may be movable with respect to the first and/or second microelectronic element 12 and 14.

The dielectric region 30 may further include one or more apertures or openings. In the embodiment depicted in FIG. 1, the dielectric element 30 includes a plurality of first apertures 33 substantially aligned with the central region 13 of the first microelectronic element 12 and a plurality of second apertures 39 substantially aligned with the central region 19 of the second microelectronic element 14, thereby providing access to contacts 20 and 26. Each aperture 33 is substantially aligned with a contact 20 of the first microelectronic element 12. Similarly, each second aperture 39 is substantially aligned with a contact 26 of the second microelectronic element 14.

As seen in FIG. 1, the dielectric region 30 may extend beyond the first edge 27 of the first microelectronic element 12 and the second edge 37 of the second microelectronic element 14. The second surface 34 of the dielectric region 30 may be juxtaposed with the front surface 16 of the first microelectronic element 12. The dielectric region 30 may be partly or entirely made of any suitable dielectric material. For example, the dielectric region 30 may comprise a layer of flexible material, such as a layer of polyimide, BT resin or other dielectric material of the commonly used for making tape automated bonding ("TAB") tapes. Alternatively, the dielectric region 30 may comprise a relatively rigid, board like material such as a thick layer of fiber-reinforced epoxy, such as, Fr-4 or Fr-5 board. Regardless of the material employed, the dielectric region 30 may include a single layer or multiple layers of dielectric material.

The dielectric region 30 may further include first and second abutting portions 7, 9 extending toward the second microelectronic element 14 and located on opposite sides of aperture 39. The first abutting portion 7 abuts the second edge 29 of the first microelectronic element, and the second abutting portion 9 abuts a spacer element 31 located between the second microelectronic element 14 and the dielectric region 30. The spacer element may be an adhesive, glass, an electrical component, metal, a dielectric element, a passive electrical component (e.g., capacitor, resistor, etc.), and/or a semiconductor element.

The spacing element 31 may be an adhesive layer and may be specifically positioned between the second end region 23 of the second microelectronic element 14 and a portion of the dielectric region 30. If spacing element 31 includes adhesives, the adhesives connect the second microelectronic element 14 to the dielectric region 30. A adhesive or spacing element 38 may be positioned between spacing element 31 and the second end region 23 of the second microelectronic element 14 to bond the spacing element 31 to the second microelectronic element 14. Another adhesive or spacing element 60 may be positioned between may be positioned between the first end region 21 of the second microelectronic element 14 and the second end region 17 of the first microelectronic element 12. This spacing layer 60 may include adhesive for bonding the first and second microelectronic elements 12 and 14 together. In such case, the spacing layer 60 may be partly or entirely made of a die-attach adhesive and may be comprised of a low elastic modulus material such as silicone elastomer. However, the spacing layer 60 may be entirely or partly made of a thin layer of high elastic modulus adhesive or solder if the two microelectronic elements 12 and 14 are conventional semiconductors chips formed of the same material, because the microelectronic elements will tend to expand and contract in unison in response to temperature changes. Irrespective of the materials employed, each of spacing layers 31 and 60 may include a single layer or multiple layers.

The microelectronic assembly 10 may further include metallized vias 70, 72 positioned within respective apertures 33, 39 of the dielectric region 30. The metalized vias 70 extend from and are electrically connected to the contacts 20 of the first microelectronic element 12, while the metallized vias 72 extend from and are electrically connected to the contacts 26 of the second microelectronic element 14. As discussed in detail below, the metallized vias 70, 72 may be formed by depositing metal within the apertures 33, 39 of the dielectric region 30.

As seen in FIG. 2, the microelectronic assembly may further include a pin 5 electrically interconnecting contacts 19 of the second microelectronic element 14 and the metallized vias 72. The pin 5 may have a tapered shape and facilitates the manufacturing process by reducing the amount of metal that needs to be inserted within the apertures 39 to form the metallized vias 72. The pin 5 may be made of a substantially rigid material, such as a metal. In lieu (or in addition to) of pin 5, the microelectronic assembly 10 may include solder.

With reference to FIG. 3, each metallized via 70 is electrically connected to a contact 20 of the first microelectronic element 12. Similarly, each metallized via 72 is electrically connected to a contact 26 of the second microelectronic element 14.

As seen in FIGS. 1 and 3, the dielectric region 30 may further include electrically conductive elements or leads 40 exposed on the first surface 32. The electrically conductive leads 40 may be traces and electrically couple the metallized vias 70, 72 to the terminals 36.

The microelectronic assembly 10 may further include a plurality of joining units, such as solder balls 81. Solder balls 81 are attached to terminals 36 and are therefore electrically interconnected to at least some of the leads 40 and contacts 20 and 26.

Figure 4:
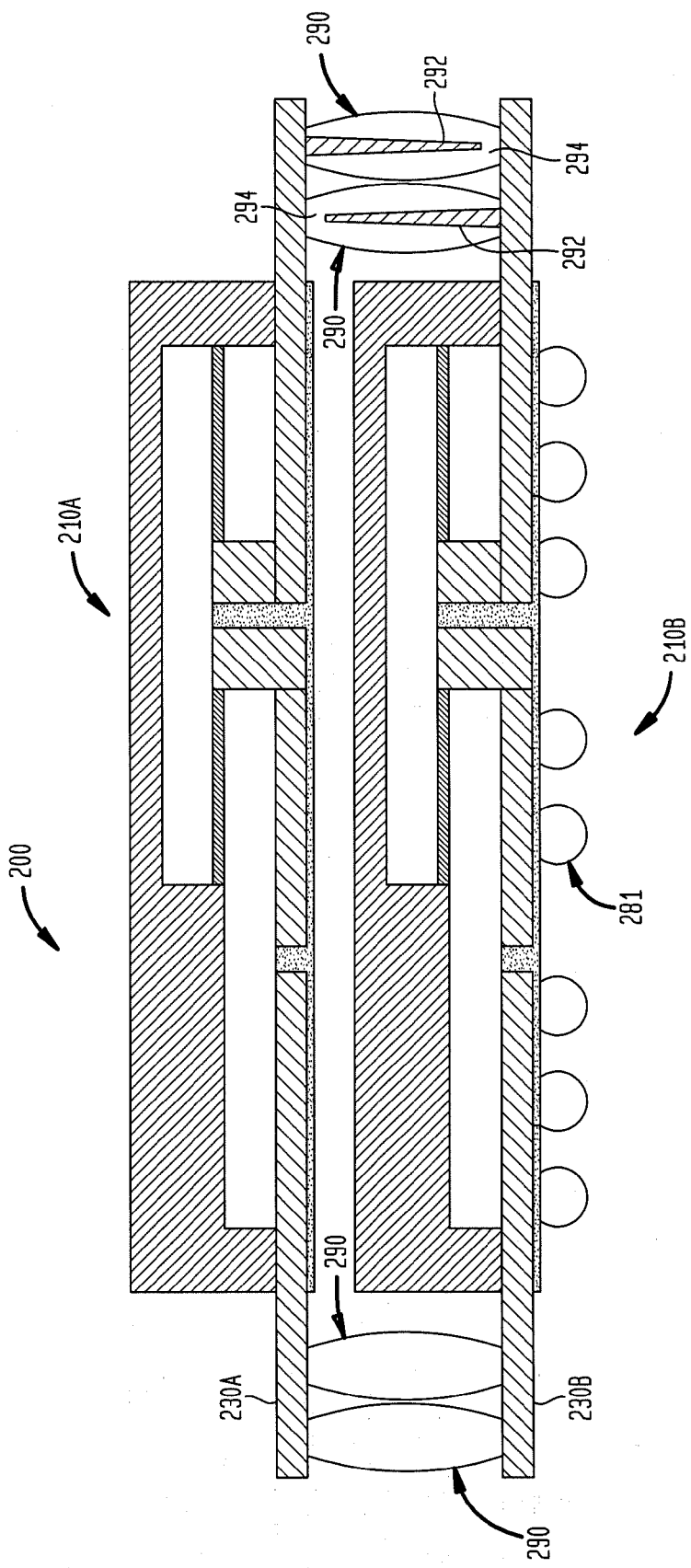
FIG. 4 is a diagrammatic sectional elevation view of a stacked microelectronic assembly according to a further embodiment of the present invention.

FIG. 4 depicts an arrangement 200 including at least two stacked and electrically interconnected microelectronic assemblies 210A, 210B. Microelectronic assemblies 210A and 210B may be any of the assemblies described above. At least one of the microelectronic assemblies may have conductive joining units attached to terminals thereof, such as solder balls 281 or other masses of bond and metal, e.g., indium, tin, or a combination thereof. The two microelectronic assemblies 210A, 210B are electrically connected to each other through any suitable electrically conductive connections. For example, the assemblies can be joined via solder columns 290 which are joined to pads (not shown) on the dielectric elements 230A, 230B of the respective microelectronic elements. In a particular embodiment also shown in FIG. 4, electrically conductive posts 292 and solder 294 can be used to electrically interconnect the two microelectronic assemblies 210A and 210B. Post 292 may extend either from the first assembly or from the second assembly towards the other, or post provided on both assemblies may extend towards each other.

Figure 5:
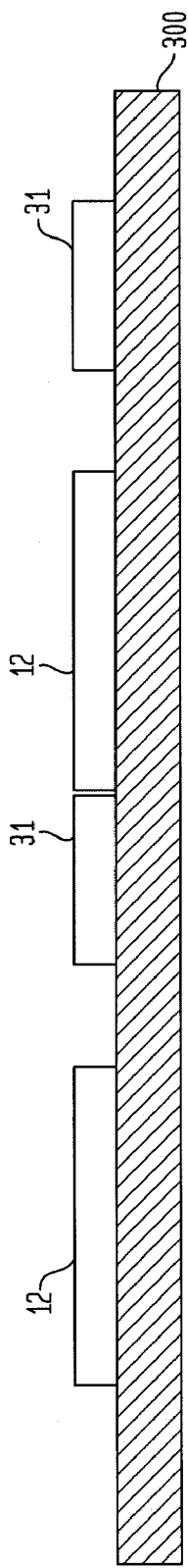
Figure 6:
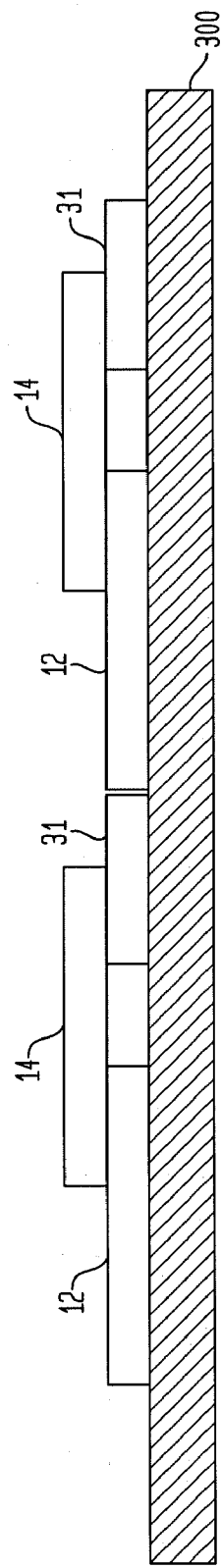
Figure 7A:
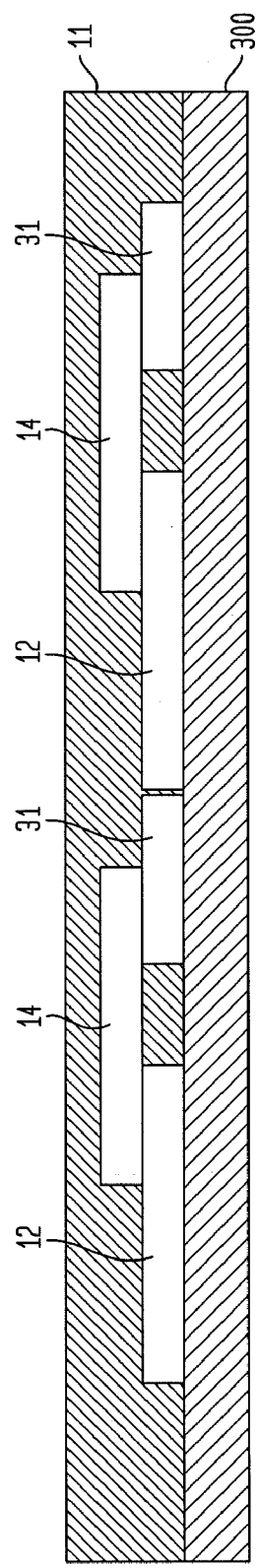
Figure 7B:
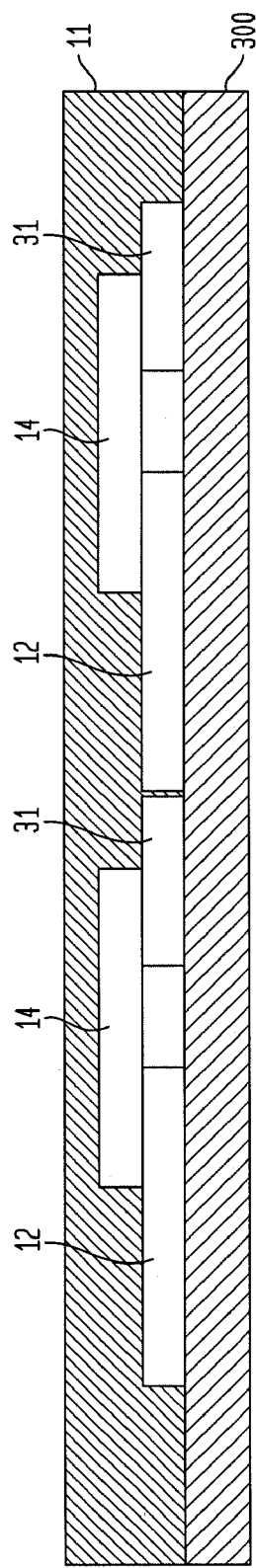

FIGS. 5-9 illustrate an exemplary method of making any of the microelectronic assemblies described above. To make a microelectronic assembly, a spacer element 31 and a first microelectronic element 12 is placed facing down on a carrier 300 with an opening between them. As seen in FIG. 5, more than one spacer element 31 and first microelectronic element 12 may be placed on the carrier 300 in a wafer or panel format. Then, a second microelectronic element 14 is placed on the spacer element 31 and the first microelectronic element 12 such that contacts of the second microelectronic element are exposed within the opening, as shown in FIG. 6. As seen in FIGS. 7A and 7B, an overmold is formed overlying the rear faces of the first and second microelectronic elements 12, 14. As shown in FIG. 7A, the overmold may even cover the opening between the first microelectronic element 12 and spacer element 31. This space between the first microelectronic element 12 and spacer element 31 is later drilled to form the metallized vias. Alternatively, as shown in FIG. 7B, the overmold does not cover the opening between the first microelectronic element 12 and the spacer element 31. As shown in FIGS. 8A and 8B, the carrier 300 is removed from the first microelectronic element 12 and spacer element 31. FIG. 8A shows the step immediately after overmolding as shown in FIG. 7A. FIG. 8B shows the steps immediately after the overmolding shown in FIG. 8B.

A dielectric region 30 is then formed overlying the front faces of the first and second microelectronic elements 12, 14 and spacer element 31, as seen in FIG. 9. The dielectric region 30 may be formed by overlying a partially cured dielectric element on the front surfaces of the microelectronic elements and heating the dielectric element to cause the material to flow. Alternatively, the dielectric region 30 may be formed by molding a dielectric material onto the microelectronic elements 12, 14. Also, openings 33 and 39 are formed by, for example, drilling through the dielectric region 30. Depending on the specific method employed, it might be necessary to drill also through a portion of the overmold 11 to form openings 33, 39. In any event, openings 33, 39 are substantially aligned with the contacts of the first and second microelectronic elements 12, 14, as shown in FIG. 9. The dielectric region may be formed using any suitable process. Suitable processes include, but not limited, spin-coating, laminating, printing, dispensing or molding.

As depicted in FIG. 10, the metallized vias 70, extending within the opening 33, 39 to the contacts are formed. The metallized vias may be formed by depositing metal to fill the openings 33, 39 and form traces extending along the major surface 32 of the dielectric region 30. The major surface 32 of the dielectric region 30 faces away from the first and second microelectronic elements 12, 14. The metal may be deposited using any suitable process. Suitable depositing processes include, but not limited, spin-coating, laminating, printing, dispensing or molding.

The metallized vias and the traces or leads 40 may be formed at the same time. The metallized vias 70, 72 and traces 40 may be formed by depositing a metal into the openings leading to the contacts of the microelectronic elements 12, 14 and onto the major surface 32 of the dielectric region 30. In particular, the traces 40 may be formed by selectively depositing metal onto traces areas of the major surface 32 of the dielectric region 30. The process of depositing metal onto traces areas may include placing a patterned seed layer on the major surface 32 of the dielectric region 30 and then placing a photo resist mask on the seed layer. Alternatively, the traces 40 may be formed by patterning the plated metal on the major surface 32 of the dielectric region 30. All the traces 40 may be positioned on the same major surface 40. In addition, terminals are then connected to the traces 40.

Although not specifically shown, solder balls may be attached to terminals of connected to traces 40. The wafer or plane may be then cut, slice or dice to separate it into individual microelectronic assemblies along dicing lane D, as shown in FIG. 10. The wafer or plane, however, may be cut before or after connecting the solder balls.

Figure 11:
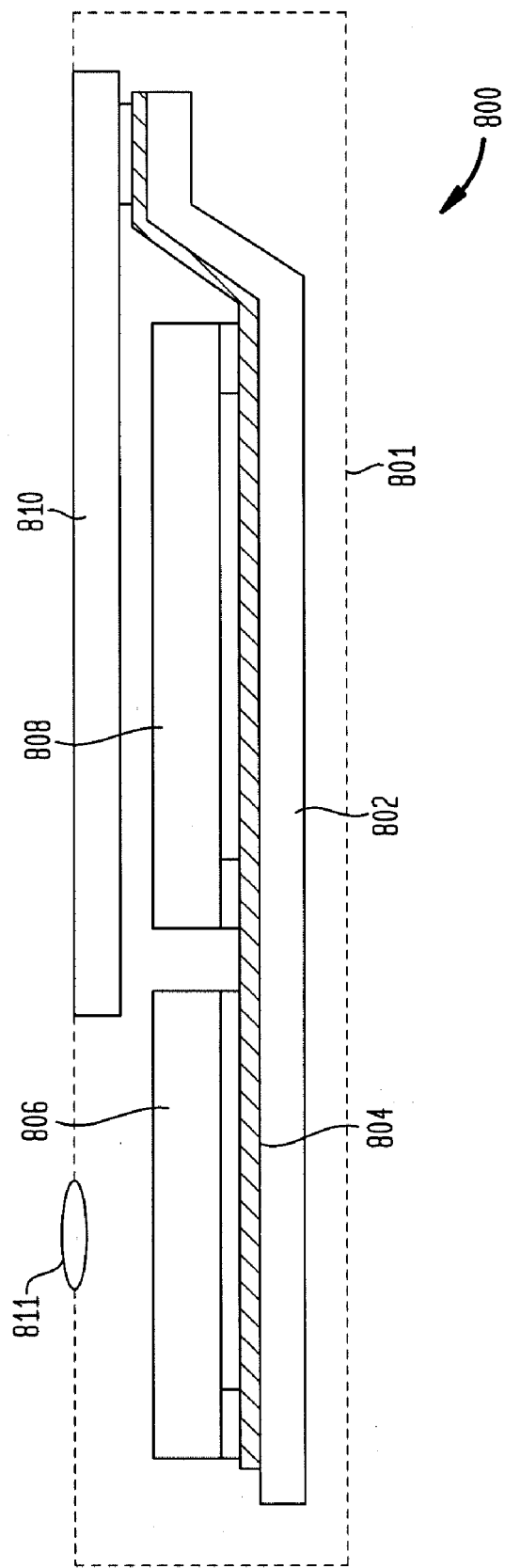
FIG. 11 is a schematic depiction of a system according to an embodiment of the present invention.

The microelectronic assemblies described above can be utilized in construction of diverse electronic systems, as shown in FIG. 11. For example, a system 800 in accordance with a further embodiment of the invention includes a microelectronic assembly 806 as described above in conjunction with other electronic components 808 and 810. In the example depicted, component 808 is a semiconductor chip whereas component 810 is a display screen, but any other components can be used. Of course, although only two additional components are depicted in FIG. 11 for clarity of illustration, the system may include any number of such components. The microelectronic assembly 806 may be any of the assemblies described above. In a further variant, any number of such microelectronic assemblies may be used. Microelectronic assembly 806 and components 808 and 810 are mounted in a common housing 801, schematically depicted in broken lines, and are electrically interconnected with one another as necessary to form the desired circuit. In the exemplary system shown, the system includes a circuit panel 802 such as a flexible printed circuit board, and the circuit panel includes numerous conductors 804, of which only one is depicted in FIG. 11, interconnecting the components with one another. However, this is merely exemplary; any suitable structure for making electrical connections can be used. The housing 901 is depicted as a portable housing of the type usable, for example, in a cellular telephone or personal digital assistant, and screen 810 is exposed at the surface of the housing. Where structure 806 includes a light-sensitive element such as an imaging chip, a lens 811 or other optical device also may be provided for routing light to the structure. Again, the simplified system shown in FIG. 11 is merely exemplary; other systems, including systems commonly regarded as fixed structures, such as desktop computers, routers and the like can be made using the structures discussed above.

Figure 12:
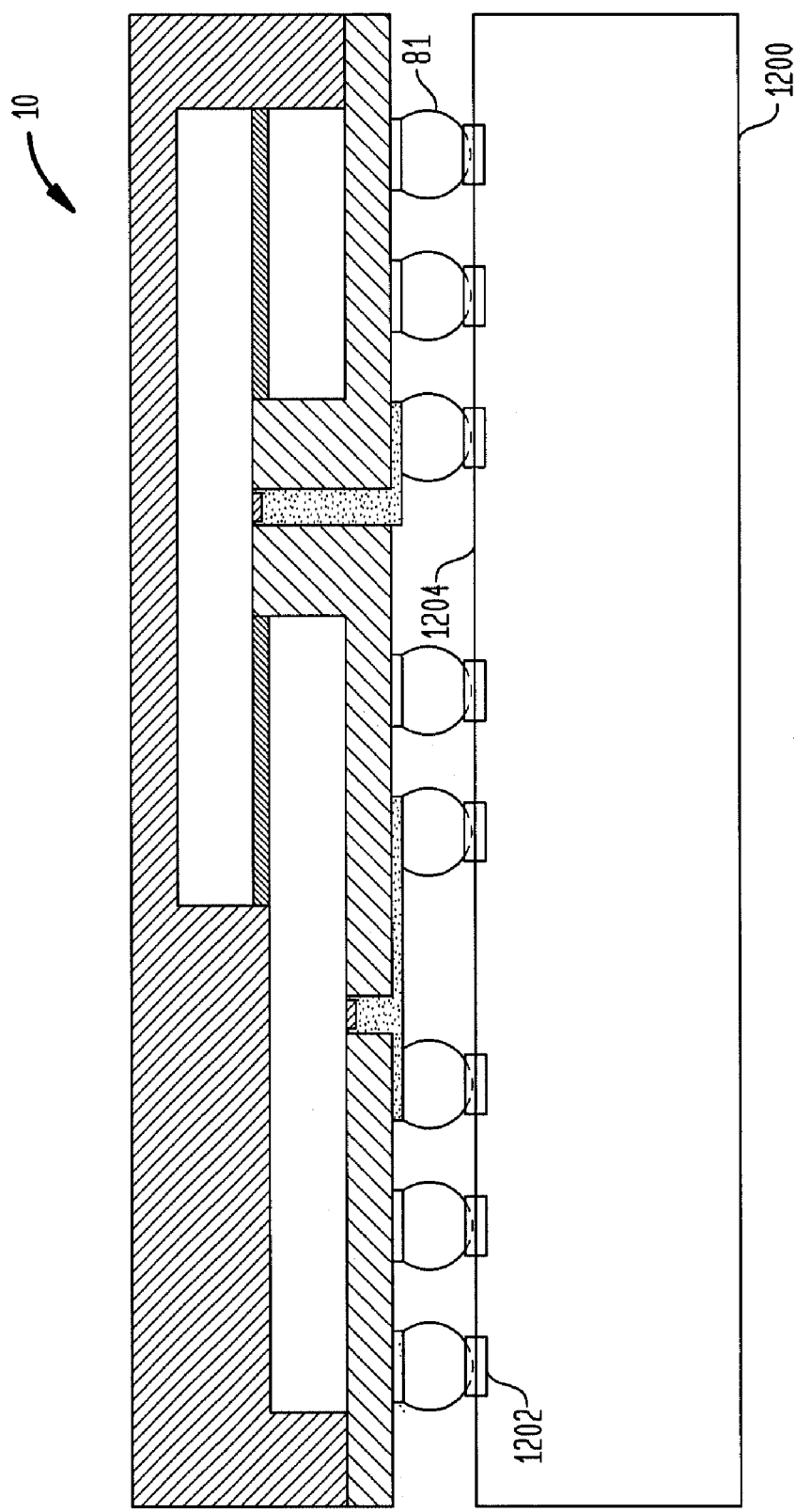
FIG. 12 is a microelectronic assembly according to an embodiment of the present invention electrically coupled to a circuit panel.

As illustrated in FIG. 12, any of the microelectronic assemblies described above may be electrically coupled to a circuit panel or board 1200. For example, microelectronic assembly 10 may include a plurality of joining units, such as solder balls 81 or other masses of bond and metal, e.g., copper pillars, indium, tin, or a combination thereof. Solder balls 81 electrically connect microelectronic assembly 10 to circuit panel 1200. While FIG. 12 only shows solder balls 81 connecting microelectronic assembly 10 to circuit panel 1200, it is contemplated that any electrically conductive element may interconnect circuit panel 1200 and microelectronic assembly 10. One or more electrically conductive elements or terminals 1202 are exposed at the first surface 1204 of the circuit panel 1200. The first surface 1204 of the circuit panel 1200 faces the solder balls 81. Solder balls 81 are attached to terminals 1202 and are therefore electrically interconnected to at least some of the circuits in circuit panel 1200.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
    a first microelectronic element having a front surface, a plurality of contacts exposed at the front surface, and a rear surface remote from the front surface;
    a second microelectronic element having a front surface facing the rear surface of the first microelectronic element and projecting beyond an edge of the first microelectronic element, the second microelectronic element having a plurality of contacts exposed at its front surface;
    a dielectric region overlying the front surfaces of the microelectronic elements, the dielectric region having a major surface facing away from the microelectronic elements;
    metallized vias within openings in the dielectric region extending from the plurality of contacts of the first and second microelectronic elements; and
    leads extending along the major surface of the dielectric region from the vias to terminals exposed at the major surface.

2. The microelectronic assembly of claim 1, wherein the at least one of the first microelectronic element or the second microelectronic element includes a dynamic random access memory (DRAM) storage.

3. The microelectronic assembly of claim 1, further comprising solder balls connected to the terminals.

4. The microelectronic assembly of claim 1, further comprising an overmold overlying the rear surface and at least partially overlies an edge surface of the first microelectronic element.

5. The microelectronic assembly of claim 4, wherein the second microelectronic element has a rear surface remote from a front surface thereof, and wherein an overmold overlies its rear surface and at least partially overlies an edge surface of the second microelectronic element.

6. The microelectronic assembly of claim 1, wherein the metallized vias are formed by depositing a metal at least within the openings.

7. The microelectronic assembly of claim 1, further comprising a support member disposed between the second microelectronic element and the face of the microelectronic assembly.

8. A stacked microelectronic assembly including at least first and second and second microelectronic assemblies, each as claimed in claim 1, the second microelectronic assembly being stacked atop the first microelectronic assembly and electrically connected thereto.

9. The microelectronic assembly of claim 8, wherein the first and second stacked microelectronic assemblies are electrically connected through electrically conductive columns extending between a front face of the second microelectronic assembly and the rear face of the first microelectronic assembly facing such front face.

10. The microelectronic assembly of claim 9, wherein each of the electrically conductive columns includes a substantially rigid metal post.

11. A system comprising an assembly as in claim 1 and one or more other electronic components electrically connected to the assembly.

12. The system according to claim 11, further comprising a housing, the assembly and the other electronic components being mounted to the housing.

13. A microelectronic assembly, comprising:
    a first microelectronic element having a front surface, a plurality of contacts exposed at the front surface, and a rear surface remote from the front surface;
    a second microelectronic element having a front surface facing the rear surface of the first microelectronic element and projecting beyond an edge of the first microelectronic element, the second microelectronic element having a plurality of contacts exposed at its front surface;
    a dielectric region overlying the front surfaces of the microelectronic elements, the dielectric region having a major surface facing away from the microelectronic elements;
    metal posts extending from the plurality of contacts of the second microelectronic element;
    metallized vias within openings in the dielectric region extending from the plurality of metal posts; and
    leads extending along the major surface of the dielectric region from the vias to terminals exposed at the major surface, the leads electrically connected to the contacts of the first and second microelectronic elements, including at least some leads extending from the vias.

14. The microelectronic assembly as claimed in claim 13, wherein at least some of the metal posts extend from the plurality of contacts of the first microelectronic element, and the leads include at least some leads extending to metalized vias extending from the at least some metal posts.

15. A method of making microelectronic assemblies, comprising:
    placing a spacer and a first microelectronic element face down on a carrier with an opening between them, the first microelectronic element including a plurality of contacts;
    placing a second microelectronic element face down on the spacer and the first microelectronic element such that contacts of the second microelectronic element are exposed within the opening;
    forming an overmold overlying rear faces of the first and second microelectronic elements;
    removing the carrier therefrom;
    forming a dielectric region overlying front faces of the first and second microelectronic elements, the dielectric region having a major surface facing away from the microelectronic elements;
    forming openings through the dielectric region to expose the contacts of the first and second microelectronic elements; and
    depositing metal to fill the openings and form traces extending along the major surface of the dielectric region.

16. The method as claimed in claim 15, wherein the step of depositing metal forms terminals at the major surface connected to the traces.

17. The method as claimed in claim 16, wherein the method further comprises attaching solder balls to the terminals.

18. The method as claimed in claim 15, wherein the step of forming the overmold includes forming the overmold in a wafer or panel format.

19. The method according to claim 18, wherein performing all the steps forms a structure containing a group of microelectronic assemblies on a wafer or panel, each microelectronic assembly including the first microelectronic assembly, the spacer, the second microelectronic assembly and the dielectric region.

20. The method according to claim 19, further comprising separating the structure into individual microelectronic assemblies.

21. The method as claimed in claim 15, wherein the step of depositing the metal includes depositing metal onto the contacts of the microelectronic elements.

22. The method as claimed in claim 15, wherein the step of forming the dielectric region includes placing a partially cured dielectric element overlying the front surfaces of the microelectronic elements and heating the dielectric element to cause material of the dielectric element to flow.

23. The method as claimed in claim 15, wherein the step of forming the dielectric region includes at least one of spin-coating, laminating, printing, dispensing or molding a dielectric material onto the microelectronic elements.

24. The method as claimed in claim 15, wherein depositing includes plating the metal.

25. The method as claimed in 15, wherein the step of forming the metalized vias and traces includes selectively depositing the metal onto trace areas of the major surface to form the plurality of traces.

26. The method as claimed in 15, wherein the step of metalizing the dielectric region further includes patterning the plated metal on the major surface to form the plurality of traces.

* * * * *

UNITED STATES PATENT AND TRADEMARK OFFICE
CERTIFICATE OF CORRECTION

PATENT NO.        : 8,378,478 B2
APPLICATION NO.   : 12/953994
DATED             : February 19, 2013
INVENTOR(S)       : Kishor Desai, Belgacem Haba and Wael Zohni Page 1 of 1

It is certified that error appears in the above-identified patent and that said Letters Patent is hereby corrected as shown below:

IN THE SPECIFICATION:

Column 1, line 65, "disclosure" should read --disclosures--.
Column 1, line 65, "is" should read --are--.
Column 2, line 1, insert --one-- before "on".
Column 2, line 33, after "assembly" delete ",".
Column 2, line 57, after "microelectronic" insert --assembly--.
Column 2, line 60, "overlies" should read --overlying--.
Column 3, lines 4 and 5, delete "and second".
Column 3, line 13, insert --.-- after "metal".
Column 4, line 2, insert --a-- before "stacked".
Column 4, line 50, "row" should read --rows--.
Column 4, line 64, "row" should read --rows--.
Column 5, line 48-49, "board like" should read --board-like--.
Column 6, line 2, "A" should read --An--.
Column 6, lines 7 and 8, delete "may be positioned between".
Column 7, line 14, "is" should read --are--.
Column 7, line 62, insert --to-- before "spin-coating,".
Column 8, line 7, "photo resist" should read --photoresist--.
Column 8, line 13, delete "of".

IN THE CLAIMS:

Column 9, line 46, "overlies" should read --overlying--.

Signed and Sealed this
Eleventh Day of November, 2014

Michelle K. Lee
*Deputy Director of the United States Patent and Trademark Office*